(12) United States Patent
Leijten-Nowak

(10) Patent No.: US 7,102,386 B2
(45) Date of Patent: Sep. 5, 2006

(54) RECONFIGURABLE ELECTRONIC DEVICE HAVING INTERCONNECTED DATA STORAGE DEVICES

(75) Inventor: Katarzyna Leijten-Nowak, Eindhoven (NL)

(73) Assignee: Koninklijke Philips Electronics, N.V., Eindhoven (NL)

( * ) Notice: Subject to any disclaimer, the term of this patent is extended or adjusted under 35 U.S.C. 154(b) by 0 days.

(21) Appl. No.: 10/525,490

(22) PCT Filed: Jul. 31, 2003

(86) PCT No.: PCT/IB03/03167

§ 371 (c)(1),
(2), (4) Date: Feb. 23, 2005

(87) PCT Pub. No.: WO2004/021356

PCT Pub. Date: Nov. 3, 2004

(65) Prior Publication Data

US 2006/0022704 A1    Feb. 2, 2006

(30) Foreign Application Priority Data

Aug. 29, 2002   (EP)   ................... 02078549

(51) Int. Cl.
*H03K 19/177* (2006.01)
*H03K 19/173* (2006.01)
*H01L 25/00* (2006.01)
*G06F 7/38* (2006.01)

(52) U.S. Cl. ............ 326/41; 326/37; 326/38; 326/39; 326/40; 326/95

(58) Field of Classification Search ............ 326/37–41, 326/95

See application file for complete search history.

(56) References Cited

U.S. PATENT DOCUMENTS

| 5,051,890 | A | | 9/1991 | Nagasaki et al. |
| 5,631,577 | A | * | 5/1997 | Freidin et al. ................. 326/40 |
| 6,054,871 | A | | 4/2000 | New et al. |
| 6,118,298 | A | | 9/2000 | Bauer et al. |
| 6,201,756 | B1 | | 3/2001 | Lee |
| 6,353,332 | B1 | * | 3/2002 | Brelet ........................ 326/40 |

FOREIGN PATENT DOCUMENTS

WO    WO 98/23033    5/1998

OTHER PUBLICATIONS

IEEE transactions on VLSI systems, vol. 9, p. 509-523 by Kim et al. "A Reconfigurable Multifunction Computing Cache Architecture", no date.

* cited by examiner

*Primary Examiner*—Rexford Barnie
*Assistant Examiner*—Jason Crawford

(57) ABSTRACT

A reconfigurable electronic device (100), e.g., a field programmable gate array (FPGA) or another type of complex programmable logic device (CPLD), has a first data storage device (120) and a second storage device (220) that are interconnected in a dual port memory mode of the reconfigurable electronic device (100). In this mode, the first data storage device (120) is accessible by a first decoder (140) both in a read as well as in a write mode, and the second data storage device (120) is accessible by a second decoder (140) in a read mode, thus providing an efficient dual port memory implementation. In a preferred embodiment, the first data storage device (120) is coupled to the second data storage device (220) via a configurable data copy circuit (160) that is responsive to a configuration signal provided via a configuration signal input (170), thus allowing for a very area efficient implementation of a dual port memory for reconfigurable electronic device (100).

5 Claims, 2 Drawing Sheets

RECONFIGURABLE ELECTRONIC DEVICE HAVING INTERCONNECTED DATA STORAGE DEVICES

This application is a 371 of PCT/IB03167 filed on Jul. 31, 2003.

The invention relates to a reconfigurable electronic device, comprising a first data storage device and a second data storage device being responsive to a control signal, the second data storage device being coupled to the first data storage device for receiving a data copy from the first data storage device; a first address decoder coupled to the first data storage device for allowing a read access of the first data storage device; and a second address decoder coupled to the second data storage device for allowing a read access of the second data storage device.

Nowadays, electronic devices require vast amounts of data to perform their designated functions. To provide the electronic devices with the data, the electronic devices are equipped with data storage devices, i.e., non-volatile or volatile memories. Such data storage devices can be used both for storing and for providing data, i.e., writing and reading. However, in some application domains, the functional requirements of the electronic device shift the usage of the data storage towards one of these two functionalities. For instance, reconfigurable logic devices (RLDs) often require more read accesses than they require write accesses from a data storage device, e.g., a look-up table (LUT), for instance in cases where the RLD implements an application that requires two operands simultaneously. To accommodate such requirements, a dual-port memory implementation of the first and second data storage devices can be chosen. In this mode, two read accesses are allowed within a designated time period, e.g., a single clock cycle, one read access from each data storage device. A single write access is allowed in such a time period, with both data storage devices being arranged to store the same data. This way, the data integrity between the two data storage devices is maintained.

The RLDs from the Virtex-II family of RLDs by Xilinx supports the implementation of a dual port memory functionality. A first LUT has a write decoder and a read decoder, whereas the second LUT has a further write decoder and a further read decoder. The data inputs of both LUTs are interconnected in the dual port memory mode to ensure the aforementioned required data integrity. During a single clock cycle, both the read and write decoders of the LUTs are accessed to allow both reading and writing during a single clock cycle.

A disadvantage of such an architecture is that it requires a significant amount of hardware to be implemented. For instance, four dedicated decoders are required to implement a single dual port memory, which increases the silicon real estate of the RLD.

Amongst others, it is an object of the invention to provide a reconfigurable electronic device according to the opening paragraph that allows for a more efficient implementation of a dual port memory.

The invention is described by the independent claims. The dependent claims describe advantageous embodiments.

The invention is based on the realization that read and write accesses within a single time period can be controlled by a single control signal, e.g., a clock signal. Consequently, a read before write operation can be performed via one and the same decoder by making the associated data storage device accessible during both read and write cycles by the same decoder, for instance by implementing the data storage architecture of the RLD as a static random access memory (SRAM). This has the advantage that a significant reduction in the amount of required hardware can be achieved. The present invention is particularly advantageous for RLDs having single output LUTs, which typically use separate decoders for reading and writing, because such devices are typically optimized for use in a combinatorial mode, i.e., a logic function generator. Consequently, no clock signals need to be present in such devices, and separate decoders are required to implement the desired data communication behavior in a memory mode of the RLD.

At this point, it is emphasized that U.S. Pat. No. 6,118,298 discloses a RLD having a single decoder for a LUT in FIG. 8 and the accompanying detailed description of the patent. However, it is emphasized that this architecture is used for a shift register implementation of the RLD rather than a dual port memory implementation with the decoder being used for read purposes only. In fact, FIG. 12 of U.S. Pat. No. 6,118,298 shows a memory implementation of the RLD, where separate read and write decoders are being used for a single LUT. Therefore, U.S. Pat. No. 6,118,298 does not teach the use of a single decoder in a memory mode of the RLD.

Furthermore, it is emphasized that in IEEE transactions on VLSI systems, vol. 9, p. 504–523 by Kim et al., a multiple-output LUT architecture having a global address decoder plus a number of LUTs each having a local decoder for implementing a cache memory is disclosed. However, both this article and U.S. Pat. No. 6,118,298 do not show how LUTs having a single decoder can be used to efficiently implement a dual port memory. Therefore, the present invention incorporates a non-obvious advantage over both documents.

It is an advantage if the read access of the first data storage device is enabled during a first phase of the control signal and the write access of the first data storage device is enabled during a second phase of the control signal; the read access of the second data storage device is enabled during a first phase of the further control signal and a data copy action from the first data storage device to the second storage device is enabled during a second phase of the further control signal; the first phase of the control signal occurring before the second phase of the control signal.

The implementation of a read-before write access mechanism based on a two-phase control signal, e.g., a clock signal, allows for a straightforward implementation of the desired functionality. For instance, a write enable switch under control of the control signal may be added to the data path to a data storage element of a data storage device, in addition to the already present select switch under control of the address decoder. This way, write accesses are only possible when both the write enable switch and the select switch are switched to a conductive state.

In a preferred embodiment, the second data storage device has a second plurality of data storage elements coupled to a first plurality of data storage elements of the first data storage device via a configurable data copy circuit. Such a data copy circuit, which may be implemented as an enable switch being responsive to a configuration signal coupled in series with a driver between a data storage element from the first data storage device and a data storage element from the second data storage device, provides a simple configurable coupling between the data storage elements of the data storage devices involved in a dual port memory implementation.

The electronic device and parts thereof according to the invention are described in more detail and by way of non-limiting examples with reference to the accompanying drawings, wherein.

Figure 1:
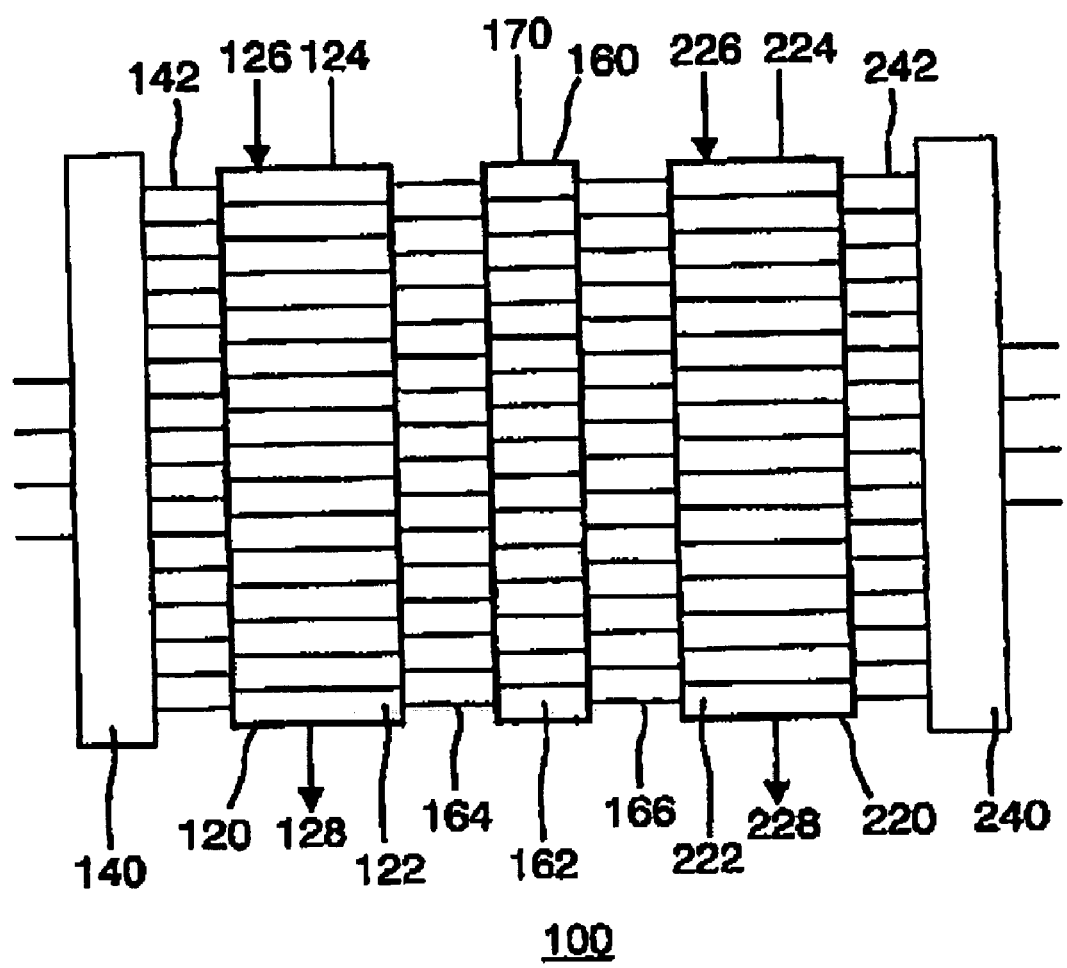
FIG. 1 shows an electronic device according to the present invention.

In FIG. 1, reconfigurable electronic device 100, e.g., a field programmable gate array (FPGA) or another type of complex programmable logic device (CPLD), has a first data storage device 120 coupled to a second data storage device 220 via a configurable data copy circuit 160 that is responsive to a configuration signal provided via a configuration signal input 170. The first data storage device 120 has a data input 126, a data output 128 and is responsive to a control signal provided via input 124. The second data storage device 220 has a further data input 226, a further data output 228 and is responsive to a further control signal provided via further input 224. The control signal and the further control signal may be different signals that are synchronized during a dual port memory implementation of reconfigurable electronic device 100, or may be identical signals. Reconfigurable electronic device 100 further includes a first address decoder 140 coupled to the first data storage device 120 for allowing a read access and a write access of the first data storage device 120 under control of the control signal provided via input 124. Electronic device 100 also includes a second address decoder 240 coupled to the second data storage device 220 for allowing a read access of the first data storage device 220 under control of the control signal provided via input 224 at least during a dual port memory implementation of the electronic device 100. Each data storage element 122 of first data storage device 120 is coupled to a select line 142 from the first address decoder 140, whereas each further data storage element 222 of second data storage device 220 is coupled to a select line 242 from the first address decoder 240. Each data storage element 122 and each further data storage element 222 are coupled to each other via a conductor 164, a data copy cell 162 from configurable data copy circuit 160 and a further conductor 166.

Preferably, in a dual port memory mode of the reconfigurable electronic device 100, the control signal and, optionally, the further control signal are two-phase signals, e.g., a clock signal. The data storage element 122 and the further data storage element 222 are configured in such a way that the read access of the first data storage device 120 is enabled and protected during a first phase of the control signal by disabling the overwriting of data element 122. Simultaneously, the read access of the second data storage device 220 is enabled and protected during a first phase of the further control signal by disabling the overwriting of the further data storage element 222. It will be understood by those skilled in the art that read actions from data storage element 122 and further data storage element 222 are enabled by providing the first address decoder 140 and the second address decoder 240 with the appropriate addresses. Again, it is emphasized that the control signal and the further control signal may be one and the same signal, i.e., a single clock signal. This is not necessary though; other types of control signals may be used, with the control signal and further control signal coming from different sources, with the further control signal being a constant signal in the dual port memory mode of the reconfigurable electronic device 100. Subsequently, a write access of the first data storage device 120 is enabled during a second phase of the control signal by enabling the overwriting of data storage element 122. Subsequently, a data copy action from the first data storage device 120 to the second data storage device 220 via the configurable data copy circuit 160 is enabled during a second phase of the further control signal by enabling the overwriting of further data storage element 222. To ensure data integrity, the first phases should occur before the second phases.

The reconfigurable electronic device 100 of FIG. 1 allows for a very efficient implementation of a dual port memory. When the dedicated copy circuit 160 is activated, the coupling of the further data input 226 to a further data storage element 222 is replaced, or bypassed, by a conductor 166. During a write action in first data storage device 120, the configurable data copy circuitry 160 is enabled by a configuration signal, e.g., a configuration bit or to a clock signal, from conductor 170, and immediately copies the data that has been written into a data storage element 122 of the first data storage device 120 into a corresponding further data storage element 222 of second data storage device 220. Connecting the dedicated copy circuit 160 to a clock signal, e.g., the control signal, has the advantage that during a read operation from the second data storage device 220 the dedicated copy circuit 160 will be disabled, thus decreasing the load on the data path including further data output 228. Alternatively, the configurable data copy circuit 160 is replaced by configurable routing circuitry not shown that connects the second address decoder 240 to the same address source not shown as that of first address decoder 140 during the second phase of the control signal.

Figure 2:
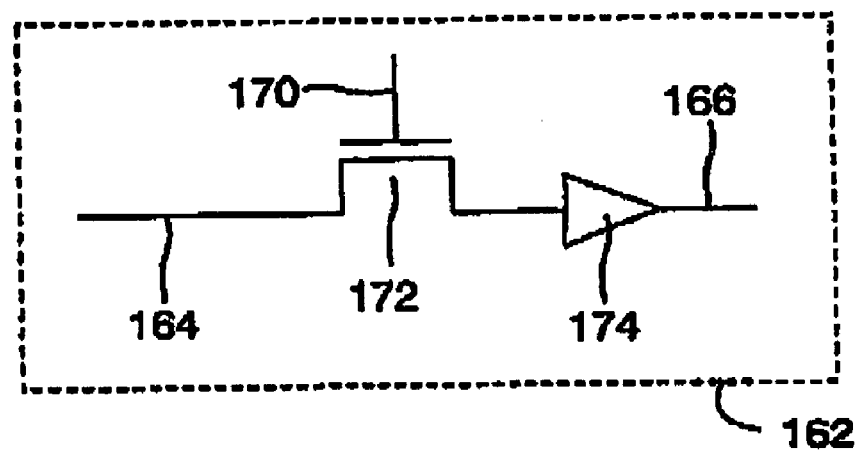
FIG. 2 shows a copy circuit cell according to the present invention.

The following FIGS. are described in backreference to FIG. 1. Corresponding reference numerals have similar meanings, unless explicitly stated otherwise. In FIG. 2, an implementation of a data copy cell 162 of configurable data copy circuit 160 is given. The data copy cell 160 receives data input from a data storage element 122 via conductor 164 and outputs this data to a further data storage element 222 via a further conductor 166. The conductor 164 and the further conductor 166 are coupled via an enable switch 172, e.g., an enable transistor, and a driver 174 for driving the appropriate signal strength to further data storage element 222. The control terminal of enable switch 172 is connected to the configuration signal input 170. The data copy circuit can be configured to become active by making the enable switches 172 conductive, i.e., by providing the control terminals of the enable switches 172 of data copy cells 162 with an appropriate configuration signal.

Figure 3A:
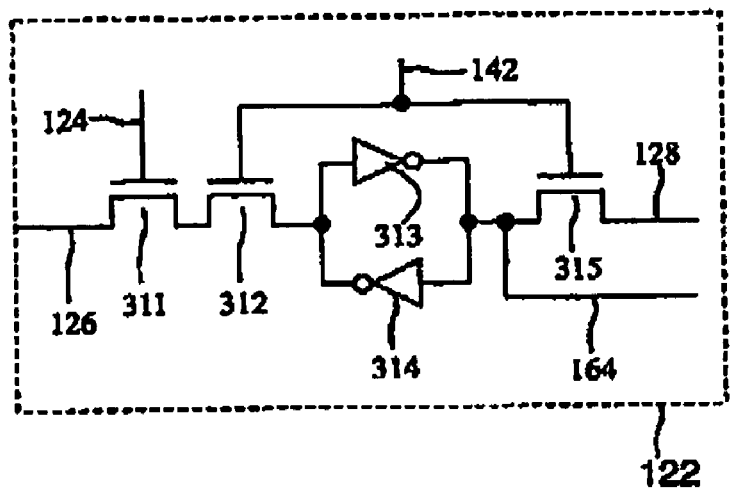
FIG. 3a shows a first data storage element according to the present invention.

FIG. 3a shows an embodiment of a data storage element 122 of the first data storage device 120. The data storage element 122 has a signal path including the data input 126 and data output 128. Data input 126 is coupled to data output 128 via a write enable switch 311, a selection switch 312, a memory cell including a first inverter 313 and a second inverter 314, and a further select switch 315. Obviously, an optional additional inverter in the output path of data output 128 may be added to make the data received via data input 124 identical to the data provided to data output 128.

Between the memory element and the further select switch 315, an additional output towards a data copy cell 162 is provided by conductor 164. The selection switch 312 and the further selection switch 315, which may be implemented as transistors, have their control terminals connected to a select line 142 from the first address decoder 140. In addition, the write enable switch 311, which may be implemented as a transistor, has its control terminal connected to the control input 124 for receiving the first control signal. If the write enable switch is disabled, for instance because the first control signal is in its first phase, the data input 126 is disconnected from the data path of data storage element 122, which becomes read-only as a result. However, the output path of data storage element 122 permanently includes conductor 164. As soon as data storage element 122 has become write-enabled and the memory element formed by inverters 313 and 314 has received new data, this data is copied to a data copy cell 162 via the conductor 164.

Figure 3B:
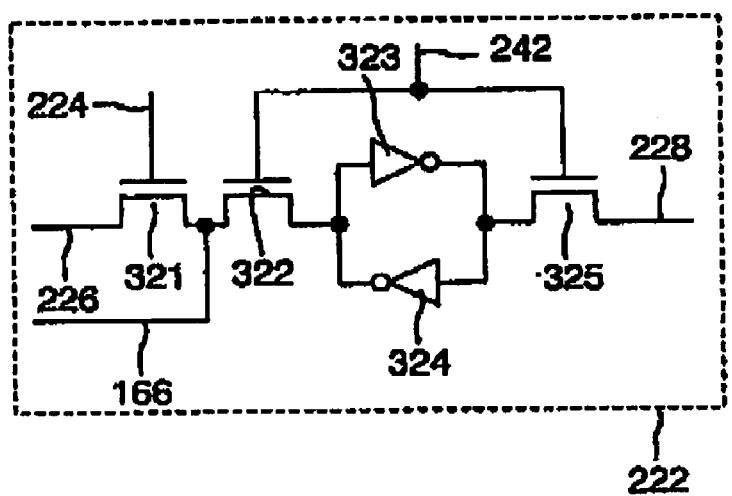
FIG. 3b shows a second data storage element according to the present invention.

FIG. 3b shows an embodiment of a further data storage element 222 of the second data storage device 220. The further data storage element 222 has a signal path including the further data input 226 and further data output 228. Further data input 226 is coupled to further data output 128 via a further write enable switch 321, a first further selection switch 322, a memory cell including a first further inverter 323 and a second further inverter 324, and a second further selection switch 325. Obviously, an optional additional inverter in the output path of further data output 228 may be added to match the data received via further data input 224 to the data provided to further data output 228. In addition, the signal path through the further data storage element 222 includes a further conductor 166 from a data copy cell 162. The further conductor 166 connected to the signal path between the further write enable switch 321 and the first further selection switch 322, thus effectively bypassing the further write enable switch 321 in a dual port memory mode of the reconfigurable electronic device 100. Optionally, the further data input 224 may be disabled during a dual port memory mode of the reconfigurable data device 100 to avoid possible data conflicts between data provided by the further data input 224 and data provided by the further conductor 166. Alternatively, the further control signal may be of a constant value, i.e., have a value that permanently disables the further write enable switch 321 in a dual port memory mode of the reconfigurable electronic device 100.

When the data copy cell 162 of configurable data copy circuit 160 that is coupled to further conductor 166 receives a new data element from the first data storage device 120, this is immediately copied to the further data element 222. This way, the second data storage device 220 operates as a shadow device of first data storage device 120. However, in an other mode of the reconfigurable electronic device 100, the copy circuit 160 will be inactive and the data path between a data storage element 122 and a further data storage element 222 will be disconnected. Consequently, the second data storage device 220 may operate independent from the first data storage device 120, with the further control signal being independent from the control signal.

Figure 4:
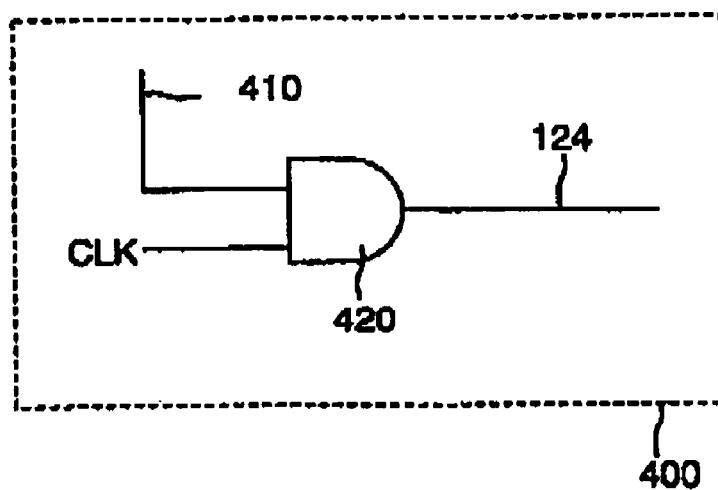
FIG. 4 shows an exemplary implementation of control circuitry for generating the control signal.

FIG. 4 shows an exemplary circuit for generating a control signal for control input 124. It will be understood by those skilled in the art that other implementations are equally feasible, and that the further control signal may be generated in a similar fashion. An AND gate 420 has a first input coupled to conductor 410, which is arranged to provide a write enable signal to the AND gate 420, indicating that the associated data storage device, i.e., data storage device 120, is to be operated in a memory mode. The second input of AND gate 420 is coupled to a clock signal CLK. Now, if CLK is high and the write enable signal on conductor 410 is high, AND gate 420 will produce a high control signal to control input 124. If desirable, the clock signal CLK may be inverted by an inverter before feeding it to AND gate 420, in order to achieve the appropriate phase behavior of the control signal.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A reconfigurable electronic device, comprising:
    a first data storage device being responsive to a control signal;
    a second data storage device being responsive to a further control signal, the second data storage device being coupled to the first data storage device for receiving a data copy from the first data storage device;
    a first address decoder coupled to the first data storage device for allowing a read access of the first data storage device; and
    a second address decoder coupled to the second data storage device for allowing a read access of the second data storage device;
    characterized in that the first address decoder is arranged to allow a write access of the first data storage device.

2. A reconfigurable electronic device as claimed in claim 1, characterized in that:
    the read access of the first data storage device is enabled during a first phase of the control signal and the write access of the first data storage device is enabled during a second phase of the control signal;
    the read access of the second data storage device is enabled during a first phase of the further control signal and a data copy action from the first data storage device to the second storage device is enabled during a second phase of the further control signal;
    the first phase of the control signal occurring before the second phase of the control signal.

3. A reconfigurable electronic device as claimed in claim 1, characterized in that the second data storage device has a second plurality of data storage elements coupled to a first plurality of data storage elements of the first data storage device via a configurable data copy circuit.

4. A reconfigurable electronic device as claimed in claim 3, characterized in that the data copy circuit comprises a data copy cell for coupling a data storage element from the first data storage device to a further data storage element from the second data storage device, the data copy cell comprising an enable switch coupled to a driver circuit.

5. A reconfigurable electronic device as claimed in claim 1, characterized in that the first data storage device and the second data storage device are look-up tables.

* * * * *